Figure 1:
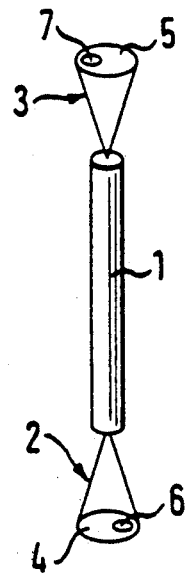

United States Patent [19]

Riegger et al.

[11] Patent Number: 5,251,012

[45] Date of Patent: Oct. 5, 1993

[54] ELECTRO-OPTICAL SCANNER

[75] Inventors: Johannes Riegger, Wurmlingen; Karl-Heinz Weber, Tuttlingen, both of Fed. Rep. of Germany

[73] Assignee: Elektrotechnik KG, Tuttlingen, Fed. Rep. of Germany

[21] Appl. No.: 743,529

[22] Filed: Aug. 9, 1991

[30] Foreign Application Priority Data

Aug. 9, 1990 [DE] Fed. Rep. of Germany ... 9011628[U]
Apr. 6, 1991 [DE] Fed. Rep. of Germany ... 9104157[U]

[51] Int. Cl.[5] .............................................. G01B 11/14
[52] U.S. Cl. ........................................ 356/374; 33/707
[58] Field of Search ............................. 350/373, 374; 250/237 G; 33/707

[56] References Cited

U.S. PATENT DOCUMENTS

| | | | |
|---|---|---|---|
| 3,295,214 | 1/1967 | Neergaard | 356/373 |
| 4,275,965 | 6/1981 | Snitzer et al. | 33/707 |
| 4,617,460 | 10/1986 | Tokunaga et al. | 250/237 G |
| 4,641,027 | 2/1987 | Renner et al. | 250/237 G |
| 4,689,485 | 8/1987 | McMurtry | 250/279 G |
| 4,806,016 | 2/1989 | Corpron et al. | 356/373 |

*Primary Examiner*—Richard A. Rosenberger
*Attorney, Agent, or Firm*—Dykema Gossett

[57] ABSTRACT

An electro-optical scanner, particularly for position-, angle- and rotation-measuring instruments as well as for optical storages, comprising an illuminated or transilluminated code carrier (5), at least one optically scannable code track on the code carrier, an optical system (7) recording the code track, and an electro-optical sensor (8), with the optical system reproducing the code track on a light-sensitive surface of the sensor, should be easily manufactured, installed and adjusted, should comprise reduced dimensions, especially a smaller working distance and should allow a better position information. Thereto, the optical system comprises at least one rod-shaped lens (13) or a micro-lens plate.

23 Claims, 9 Drawing Sheets

ELECTRO-OPTICAL SCANNER

The invention refers to an electro-optical scanner according to the precharacterizing portion of claim 1.

In known electro-optical angle-, rotation- and position-measuring instruments, a light beam scans the code track of a code carrier or encoder, and a sensor measures the intensity modulation of the light caused by the code track. In incremental measuring systems, the intensity modulations are only counted to determine the position. The information of position may be lost by failure of power supply. Absolute measuring systems have, however, a plurality of code tracks comprising different codings, the code track allowing a determination of the position on the basis of the determined code information.

A transilluminating method is frequently used in these optical measuring assemblies. A beam is collimated by a lens and is transmitted through a fixed lattice. The code track of the code carrier defines a corresponding lattice having an identical scale and being movably located behind the fixed lattice with respect to the direction of the light path. Suitable sensors are placed behind the code carrier, the sensors measuring the light transmission in case of congruent orientation of the lattices, and the dimming of light in case of displaced orientation of the lattices. The distance covered can be determined by counting the transitions of a code track, respectively by measuring the informations of parallel code tracks. The expense for the plurality of lattices is relatively large. Diffraction and other optical effects cause a widening of the running through beam and, by this, influence the exact measurement. A high resolution of the lattice is therefore difficult to achieve. The widening of the beam is responsible for the necessary large electronic analysis equipment in absolute measuring systems having up to 24 tracks. Finally, the partly translucent code carriers or scales of glass become a problem in some applications, especially in the machine tool technology.

Known optical data storages have a code track which is illuminated and read from the same side. The light of a light source is focussed on the code track by a lens and the diffuse reflected light is balanced out after running through the identical lens by a beam splitting system. That technology is only suitable for the reading of one code track but problematic for focussing the light beam.

The FR-A1-2 566 896 discloses an electro-optical assembly for scanning movable code carriers in which gradient index lenses are used for both collimating the incident light and transferring the transilluminated light. The transferring lenses focus the light from the surface areas of the code carrier into optical fibres which are connected with light-sensitive sensors. That allows the integral determination of light quantity passing across the field of vision, with the light quantity being correspondingly changed with the light transmission which changes according to the distance covered. That expensive structure leads to adjusting problems and does not work very well. Further, the space required is relatively big due to the relatively large focal distances and length dimension of the lens system.

From the DE-OS 34 27 067, an assembly of the type as described at the beginning is known by which a coded absolute scale is scanned by an optical system and is such reproduced on an electro-optical cell sensor, that at least scale line and one straight line code are recorded. The resolution of that assembly is not very high since the straight line code for the absolute position information is located between each of two adjacent scale lines. Further, the known optical system is very costly, and a large working distance is necessary.

The object of the invention is to improve an electro-optical assembly of the type as described at the start such that the assembly can be easily manufactured, installed, and adjusted, that the assembly comprises reduced dimensions, especially a smaller working distance, and allows a better position information.

According to the first solution of the invention, the code carrier comprising a code track is located in the object plane on one side of the rod-shaped lens so that this lens generates a scale model of the area of the code track in an image plane on its other side, the image plane being part of the light-sensitive sensor surface. Advantageously, the lens and the sensor are placed on the same side of the code carrier allowing a simple installation of the assembly. The arrangement only on one side of the code carrier also causes a reduced procedure for alignment and adjustment. The reproduction of the code track avoids diffraction and other disadvantageous optical effects, whereby a high resolution is achieved. Therefore, the assembly is especially suitable for scanning a plurality of adjacent code tracks being close together.

A reproduction of the code track on the sensor by means of usual lenses is not practical due to the significant expense for an exact reproduction. In the invention, a rod-shaped lens is provided such as used in printers for the reproduction of radiant diode lines on the circumference of a tinting drum with an image scale of 1:1. The rod-shaped lenses may have a variable refraction index, and may be so-called "gradient index lenses".

According to the alternative solution of the invention, a micro-lens plate reproduces optionally scaled the code track on the light-sensitive sensor surface of the electro-optical sensor. A micro-lens plate comprises a plate-shaped carrier which has at least a two-dimensional field of lenses. The lenses can have a spheric curvature and can be incorporated in a homogenous, photo-sensitive glass plate by means of a photo-thermal process. The curvatures of the lenses are preferably located at corresponding positions on opposed sides of the plate. Non-transparent areas may be arranged therebetween. A suitable micro-lens plate is offered by the company Corning Incorporated under the registered trademark "SMILE".

The expense for the inventive assembly is relatively low as the micro-lens plates are cheap. The assembly has relatively small dimensions because of the low thickness of the micro-lens plates, typically 1.4 mm and the small working distances to the object or image plane such as 1.8 mm. The small working distance is especially suitable for angle and rotation measurements. As a consequence of the arrangement of lenses in fields and the optionally overlapping fields of vision, the assembly can operate with a high resolution quality, and can reproduce a large number of parallel code tracks.

According to an embodiment of the invention, a plurality of rod-shaped lenses is arranged parallel to each other between the code carrier and the sensor whereby a reproduction of a plurality of code tracks is favoured on a sensor having light-sensitive sensor surfaces according to the code tracks.

If the parallel lenses have partly overlapping fields of vision on the code carrier according to a further embodiment of the invention, the light intensity of the reproduction is enhanced since overlapping areas within the object plane correspond to overlapping areas within the image plane. The intensity of reproduction becomes enhanced according to the number of overlapping fields of vision.

In a further embodiment of the assembly comprising overlapping fields of vision of the lenses, each of a pair of lenses comprises a first lens in which the light of the light source is eccentrically fed in on the side opposed to the code carrier and a second lens in which the light which has the contrary direction with respect to the fed-in light, is eccentrically balanced out towards the sensor on the side opposed to the code carrier. The eccentrically introduced light undergoes a first image inversion in the first lens, and is projected into the overlapping area of the fields of vision of the pair. The light reflected from the overlapping area undergoes a second image inversion in the second lens, and is eccentrically balanced out into the sensor. Directly adjacent lenses can be so used for the exact input and output coupling of light. According to another embodiment of the invention, a screening wall is placed between the light source and the sensor to reduce perturing interferences on the measurement.

According to a further embodiment of the invention, the rod-shaped lenses are interconnected and define a bundle. The bundle of lenses is easier to fix and to adjust, and allows a practically continuous reproduction of a plurality of code tracks in an image plane.

The assembly has for example a light source which is located on the same side of the code carrier as the optical system for illuminating the code track. Non-translucent materials are used for the manufacture of the code carrier if these materials are provided with a code track which reflects the light. However, that arrangement can be problematic with a low working distance of the optical system. According to a preferred embodiment of the invention, the light source is therefore located on the side of the code carrier, which is opposed to the sensor, and transilluminates the code carrier. For that, a translucent code carrier comprising a non-translucent code track is frequently used. In this arrangement, the illumination level of the code track is not influenced by the optical system.

Because of the physical manufacturing process, the lenses of known micro-lens plates are made of glass and are formed as simple spheric or hemisperical lenses. That leads to optical disadvantages. According to a preferred embodiment, the lenses of the micro-lens plate have an aspheric curvature whereby especially the reproduction quality and the intensity of light of the reproduction are improved.

Micro-lens plates of glass comprise further the disadvantage that they have a relatively high price and are problematic with respect to the attachment. Thereto, they have to be normally fixed in a special frame. According to an especially preferred embodiment, the micro-lens plate is therefore made of plastic, especially dye-casted.

That method of production is relatively cheap and also allows the realization of other lens curvatures and supports.

According to a further embodiment, the micro-lens plate comprises micro-lens fields which are arranged in zones and which can serve for the detection of code tracks which are located on the code carrier in a special manner. This freedom of structural design is especially given in the photo-thermal method of production of the micro-lens plates of glass or the injection technology of plastic plates.

According to still another embodiment of the invention, the contour of the micro-lens plate at least selectively corresponds to the contour of the code carrier, with the contour of the plate being especially rectangular, circular or ring-shaped. By this, the optically scannable surface of the code carrier can be used for code information.

If the code carrier has at least one optically scannable reference track and the sensor comprises at least one light-sensitive reference sensor surface associated with the reference track for the detection of a misalignment of the code carrier to the sensor, and if an evaluation unit is provided for transforming the signals of each reference sensor surface in control signals, and if at least one positioning element engages the sensor to align the sensor on the code carrier in dependence on the control signals, misalignments are compensated during installation or operation by automatic adjustment of the sensor. Originally, a coarse adjustment of the sensor is only required since the sensor is dynamically guided to the optimal position with respect to the code carrier after the initial operation. Misalignments as a consequence of operational influences, such as inacurate guidance of the code carrier, thermal expansion or wear are compensated without any readjustment. Therefore, a cheaper guidance mechanic comprising greater tolerances can be fundamentally used.

Adjusting problems are reduced if parallel reference tracks and associated reference sensor surfaces are provided, the differential signals thereof being transformed in control signals by the evaluation unit. The sign of the differential signal can indicate the direction of displacement or tilt.

It is preferred to use at least one reference track and at least one reference sensor surface for the detection of a misalignment developed by a crosswise displacement of the reference track. Therefor, two reference sensor surfaces can at best partly record each of the associated reference tracks in transverse direction with the distance between the faced sides of the two reference sensor surfaces corresponding to the distance between the faced sides of the reference tracks. If a displacement in transverse direction occurs, one reference sensor surface is at least partly outside of the associated reference track whereas the other reference sensor surface remains in the area of its reference track. That causes a significant differential signal. Preferably, the distance of the two reference tracks from each other nearly corresponds to the dimension of a reference track in transverse direction so that misalignment developed by a tilt of the reference tracks to the sensor have only a low influence on the signals which are generated by a displacement in transverse direction.

Preferably, at least one reference track and at least one reference sensor surface are provided for the detection of a misalignment developed by a tilt of the reference track to the sensor. By this, a further degree of freedom of the misalignment is compensated. Therefore, the distance from the inner surface of one reference sensor surface to the outer surface of the other reference sensor surface can correspond to the distance from the inner surface of one reference track to the outer surface of the other reference track. Especially if the reference sensor surfaces are identical, a displacement in transverse direction has practically no influence on the measured differential signal which practically only indicates the tilt. When the two reference tracks are located on both sides of the code tracks, small tilts even cause relatively large variations of the differential signal. The security of detection is further improved, if two pairs of parallel reference sensor tracks and reference sensor surfaces are used, with the pairs of reference sensor surfaces being displaced from each other with respect to the direction of the reference sensor tracks.

The positioning element can be a micro-mechanical means or can be manufactured on the basis of a piezo crystal.

Figure 2:
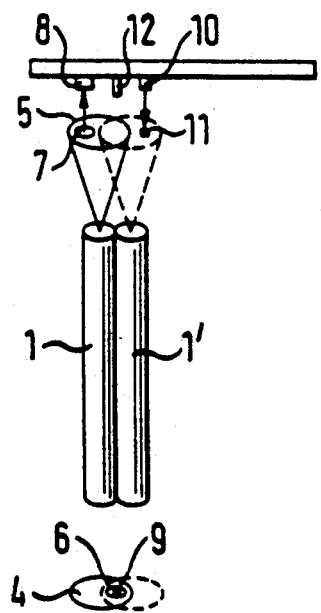
Figure 3:
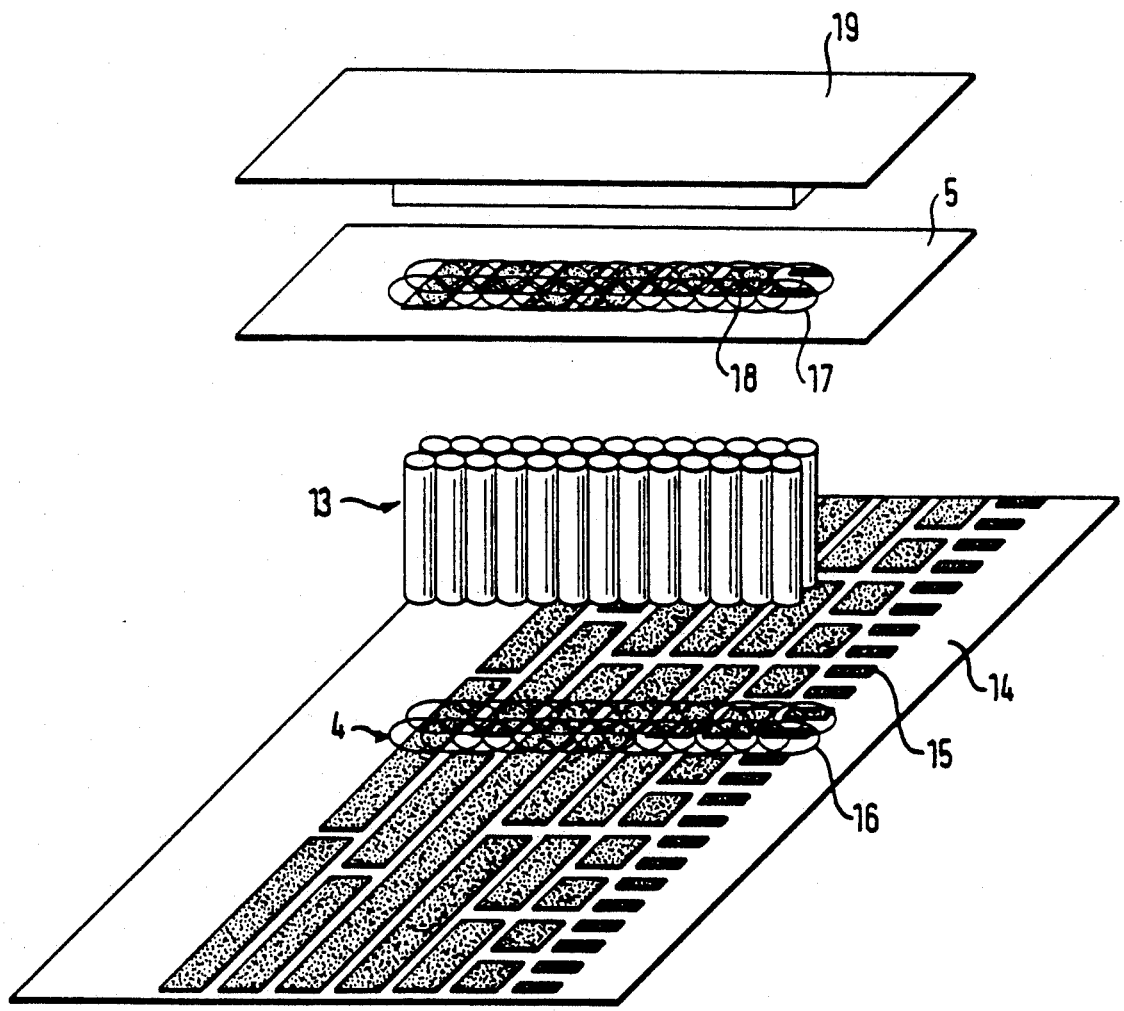
Figure 4:
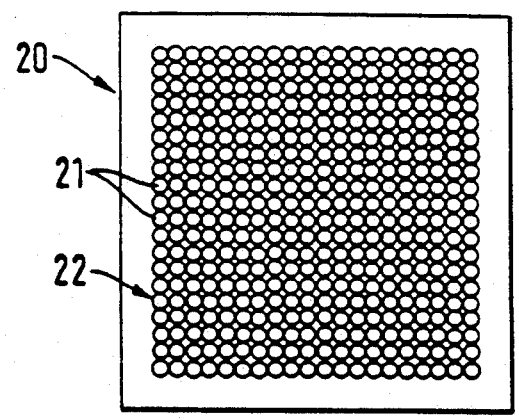
Figure 5:
Figure 6:
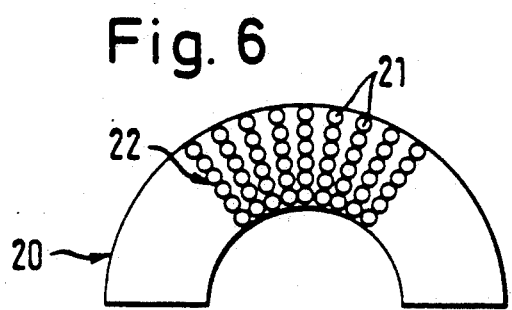
Figure 7:
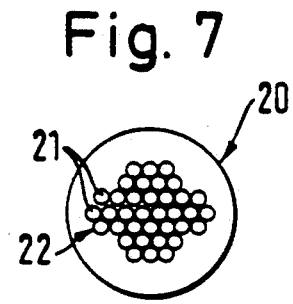
Figure 8:
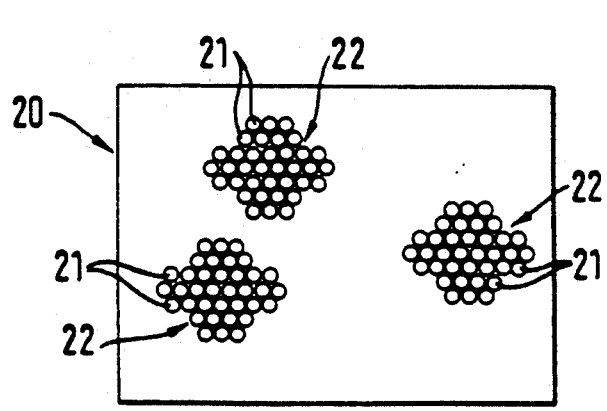
Figure 9:
Figure 10:
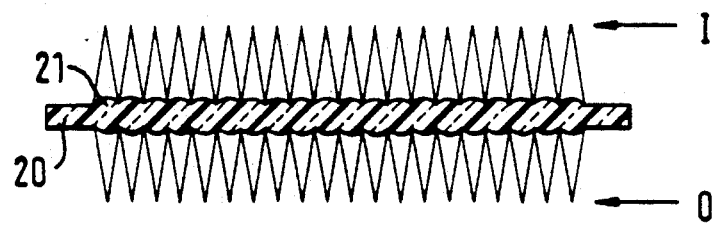

Further details and advantages of the subject matter of the invention become apparent from the following description considered in connection with the accompanying drawings which show preferred embodiments. The drawings show:

FIG. 1 an assembly comprising a rod-shaped lens in perspective view obliquely from the top;

FIG. 2 an assembly comprising two rod-shaped lenses in perspective view obliquely from the top;

FIG. 3 an assembly comprising a lens pack in perspective view obliquely from the top;

FIG. 4 a rectangular-shaped micro-lens plate in top view;

FIG. 5 the same micro-lens plate in cross-sectional view;

FIG. 6 a half ring-shaped micro-lens plate in top view;

FIG. 7 an annular micro-lens plate in top view;

FIG. 8 a rectangular-shaped micro-lens plate comprising three micro-lens fields arranged in zones, in top view;

FIG. 9 a micro-lens plate having identical working distances to the object plane and the image plane, in cross-sectional view;

FIG. 10 a micro-lens plate with identical working distances to the object plane and the image plane in cross-sectional view, with the working distances being enlarged compared to those of FIG. 9.

Figure 11:
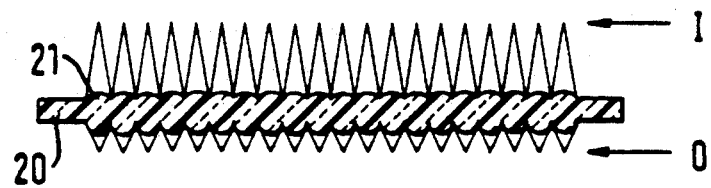
Figure 12:
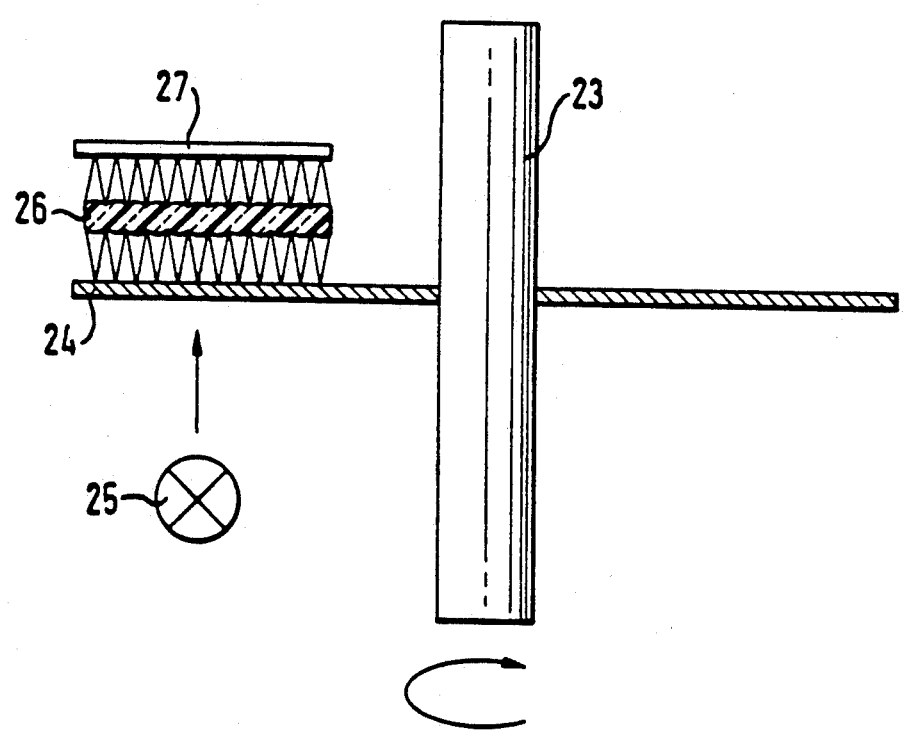
Figure 13:
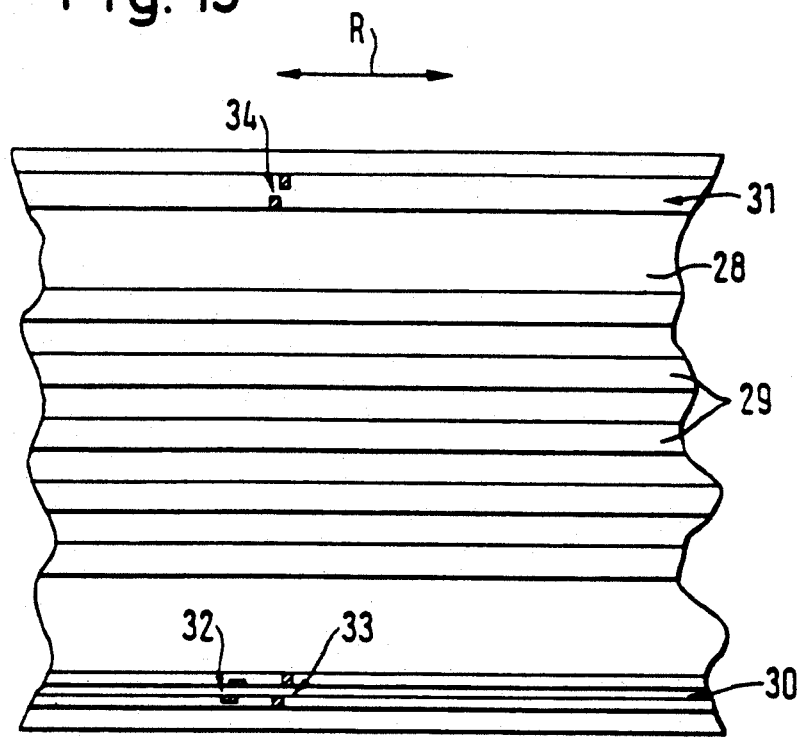
Figure 14:
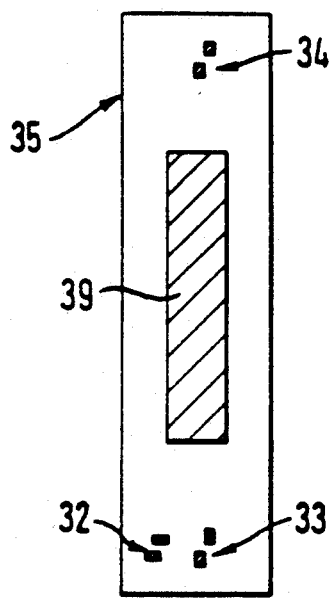
Figure 15:
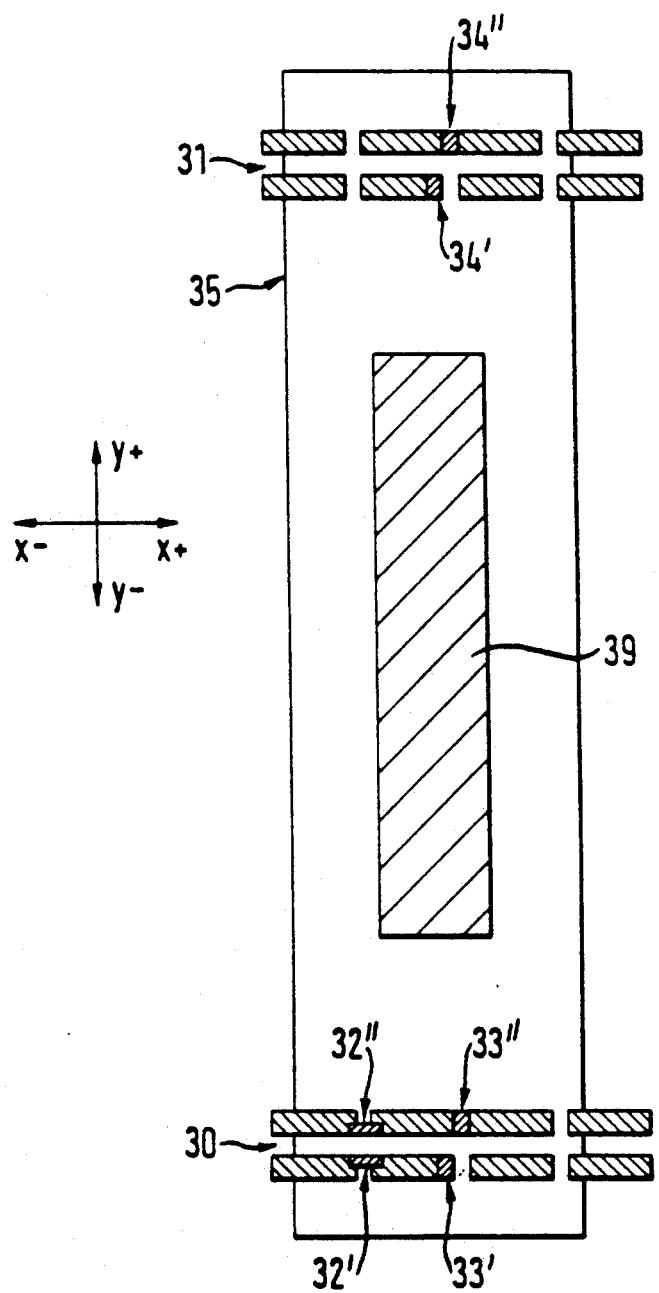
Figure 16:
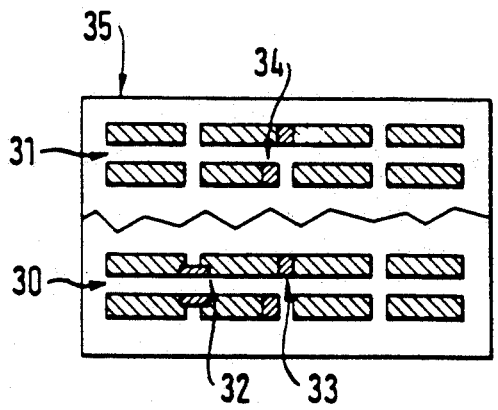
Figure 17:
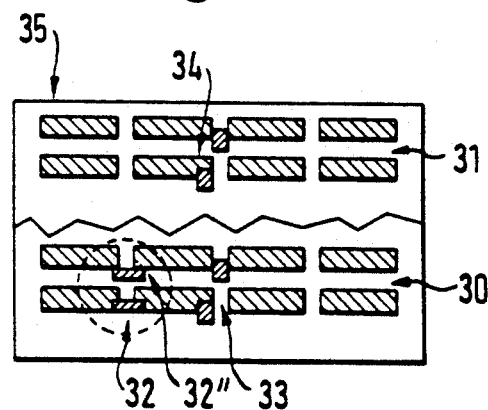
Figure 19:
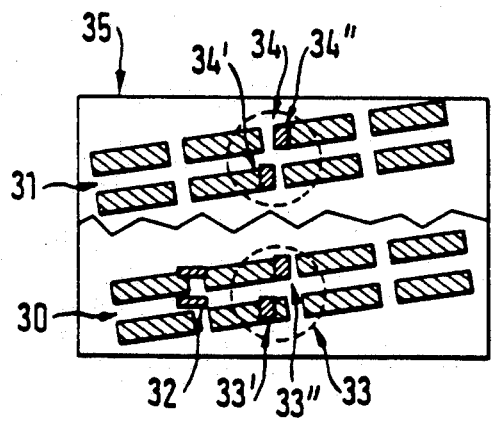
Figure 18:
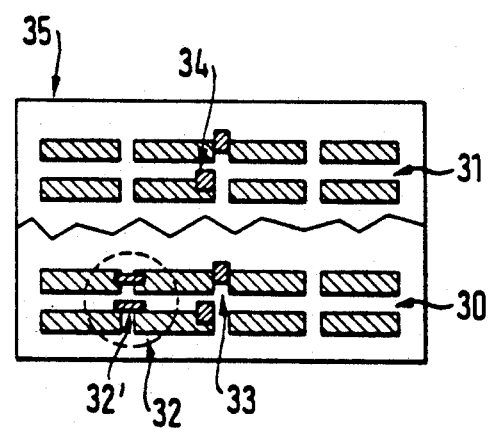
Figure 20:
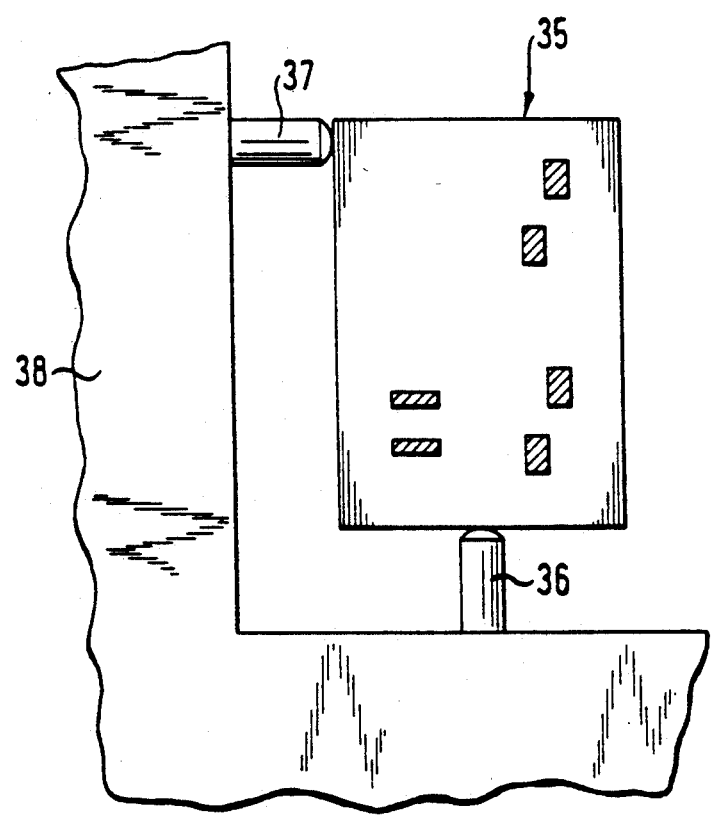

FIG. 11 a micro-lens plate having different working distances to the object plane and the image plane, in cross-sectional view;

FIG. 12 an electro-optical scanner arranged in a rotation angle transmitter, in sectional elevation;

FIG. 13 a sector of a code carrier comprising reference tracks, in top view;

FIG. 14 a sensor for the code carrier according to FIG. 13, in top view;

FIG. 15 the same sensor aligned along reference tracks, in enlarged top view;

FIG. 16 the optimal position of the reference sensor surfaces with respect to the reference tracks, in top view;

FIG. 17 a code carrier comprising reference tracks which are upwardly displaced with respect to reference sensor surfaces, in top view;

FIG. 18 a code carrier comprising reference tracks which are downwardly displaced with respect to reference sensor surfaces, in top view;

FIG. 19 a code carrier comprising reference tracks which are tilted with respect to reference sensor surfaces, in top view;

FIG. 20 a sensor comprising positioning elements in top view.

Referring to FIG. 1, a cylindrical rod-shaped lens 1 comprises fields of vision 2, 3 located on both frontal surfaces of the lens, the lower field of vision 2 sharply reproducing an object plane 4 in an image plane 5 of the upper field of vision 3. An item 6 being in the right part of the object plane 4, is reproduced at position 7 in the image plane 5 with a scale of 1:1, with an image inversion, however, taking place. That means, an item being in the object plane 4 right from the axle center of lens 1 is reproduced in the left part of the image plane 5.

The image plane 5 of the assembly is directed on the code track of a—not shown—code carrier so that code information can be read by a—also not shown—sensor which comprises a light-sensitive sensor surface and which is placed in the image plane 5. The illumination is usefully effected from the lens side of the code carrier by a light source which is also not shown in FIG. 1.

Referring to FIG. 2, two cylindrical rod-shaped lenses 1, 1' are shown. The lens 1 comprising an object plane 4 is directed on a—not shown—code carrier as described above, with its image plane 5 falling on a light-sensitive surface of a sensor 8. For reasons of clarity, the sensor 8 is shown spaced apart from the image plane 5.

The lens 1' is laterally arranged to lens 1, and directs parallel thereto. The lower field of vision of lens 1' overlaps with the lower field of vision of lens 1 in the object plane 4 whereby a lens-shaped overlapping area 9 is defined. The light of a light source 10 is eccentrically fed in the upper field of vision of lens 1'.

Because of the image inversion, a light point 11 is transmitted through the lens 1' to the overlapping area 9. A further image inversion in the lens 1 causes that the image 7 of the point 6 being illuminated on the code carrier can be eccentrically balanced out from the lower field of vision of lens 1 to the photo-electric sensor 8. Therewith, a code track can be exactly illuminated with a screening wall 12 located between the sensor 18 and the light source 10 suppressing perturbing effects.

FIG. 3 shows a pack 13 of lenses of the above described type comprising an image scale of 1:1. The pack is arranged above a code carrier 14, the seven code tracks 15 thereof including different code informations and allowing an absolute distant measurement. To obtain a sharp reproduction of the object, the lens pack 13 is spaced from the object plane 4 for a basis distance. The lower fields of vision of adjacent lenses of the pack 13 partly overlap in the object plane as shown by circular border lines 16, each one being assigned to one lens.

In the image plane 5 above the lens pack 13, the areas of the code carrier 14 which are encircled by the border lines 16 are reproduced as indicated by border lines 17. The contrast between bright and dark image sections is especially large in the lens-shaped overlapping area 18 of adjacent border lines 17.

A photo sensor 19 has light-sensitive surfaces at its bottom, with the surfaces being positioned in the image plane 5 which has a predetermined reproduction distance from the lens pack 13. For reasons of clarity, the photo sensor 19 is, however, shown at a distance from the image plane 5. The light-sensitive surface of sensor 19 may include matrix-likely distributed sensor elements allowing an association of the received light signals with the code tracks 15 of code carrier 14.

In the micro-lens plates according to the FIGS. 4 to 9, the plate-shaped carriers are marked with the reference number 20 and the micro lenses provided thereon are marked with the reference number 21. The various structural designs are favoured by using plastic for the production of the micro-lens plates 20.

Referring to FIGS. 4 and 5, the micro-lens plate 20 is rectangular and the micro lenses 21 formed thereon define a correspondingly shaped field 22. Laterally of field 22, edges are defined for supporting the micro-lens plate 20. This structure is especially suitable for the use in position measuring instruments.

According to FIG. 6, the half ring-shaped micro-lens plate 20 comprises a field 23 of micro lenses 21 which are arranged radially adjacent to each other in chains. This arrangement can be useful for example for angle measuring instruments.

FIG. 7 shows a cross-like field 22 of micro lenses 21 within the annular micro-lens plate 20. This arrangement can be useful in scanners for code carriers which are moved in two directions orthogonal to each other.

According to FIG. 8, the fields 22 of micro lenses 21 are located at different positions so that these fields can be associated with correspondingly spaced code tracks of a code carrier.

The micro-lens plates according to FIGS. 9 to 11 comprise a plate 20 of any contour and micro lenses 21 provided on the plate 20, with the micro lenses comprising according to FIG. 9 a curvature spheric on both sides, according to FIG. 10 a on both sides aspheric curvature and according to FIG. 11 the micro lenses comprising an aspheric a spheric curvature on one side and the other side, respectively.

Referring to FIG. 9, the micro-lens plate has identical working distances to the object plane ○ and to the image plane I. According to FIG. 10, the working distances to the object plane ○ and to the image plane I are also identical but larger than the working distances of the microlens plate of FIG. 9. FIG. 11 shows asymmetrical working distances, with the distance to the object plane ○ being very small and the distance to the image plane I being very large.

FIG. 12 shows a rotation angle transmitter comprising a shaft 23 which is rotatable around its longitudinal axis according to the drawn rotation arrow. The shaft 23 carries a code disc 24 comprising code tracks adjacent to its outer surface.

A light source 25 is arranged below the code disc 24. On the opposed side of the code disc, a micro-lens plate 26 which reproduces the object plane being in the area of the code tracks, on the light-sensitive surface of an electro-optical sensor 27, is provided. Together with the light source 25, the electro-optical scanner can be positioned within a fork-shaped case in a space-saving way, the case being adjusted to the code disc 24 with a relatively low assembling expense.

According to FIG. 13, the code carrier 28 has a pair of reference tracks 30, 31 located on each side of the code tracks 29, for an automatic adjustment of misalignments between the sensor and the code carrier 28. The code carrier 28 can move along the direction indicated by the double arrow R. Light-sensitive reference sensor surfaces 32, 33, 34 of the sensor record misalignments and are drawn in FIG. 13 for demonstration.

According to FIG. 14, a sensor surface 36 is provided on the bottom side of sensor 35, for the detection of information in the code tracks 29. On both sides of the sensor surface 36, the reference sensor surfaces 32, 33, 34 are provided.

FIG. 15 shows that the reference sensor surfaces 32', 32'', 33', 33'', 34', 34'' of the sensor 35 compactly terminate with the sides of both pairs of reference tracks 30, 31, if the sensor 35 is optimally adjusted to the code carrier. The reference sensor surfaces 32', 32'' serve for the detection of misalignments in y+ and y− directions whereas the reference sensor surfaces 33', 33'' and 34', 34'' serve for the detection of tilts of the reference tracks 30, 31 to the sensor 35.

To clarify the description, it is referred to FIGS. 16 to 19. FIG. 16 also shows the optimal adjustment of the reference sensor surfaces 32, 33, 34 to the reference tracks 30, 31.

FIGS. 17 and 18 demonstrate that the reference sensor 32'' is located outside of the upper reference tracks of the pair of reference tracks if the code carrier 35 is upwardly misaligned in y+ direction, whereas the reference sensor 32' is located outside of the lower reference tracks of the pair of reference tracks 30 if the code carrier 35 is downwardly displaced. The reason therefor is that if an optimal adjustment (FIG. 16) is present, the reference sensor surfaces 32 are in true alignment with the inner surfaces of the reference tracks 30, and have a smaller extension (about one third) than the reference tracks, in the transverse direction of the reference tracks 30. The signals of the reference sensor surfaces 32', 32'' are transformed in a differential signal by an evaluation unit. The differential signal leads to less adjustment problems, and is proportional to the distance from the optimal position. As FIGS. 17 and 18 also show different signals between the pairs of reference sensor surfaces 33 and 34 are not generated by the displacement.

However, FIG. 19 shows that a tilt of the code carrier 35 to the sensor causes differences in the signals of the pairs of reference sensor surfaces 33, 34. The reference tracks 30, 31 are interrupted at regular distances so that the reference sensor surfaces 33, 34 being normally on both sides in true alignment with the reference tracks introduce not only differently over the sides of the reference tracks 30, 31 but also in spacings of different reference tracks elements. The differential signals of the reference sensor surfaces 33', 34' and 33'', 34'' can be recorded by the evaluation unit and as they represent a rate for the degree of the tilt can be transformed in a control signal for the correction of the misalignment.

According to FIG. 20, the sensor 35 is supported by a case or frame 38 via positioning elements 36, 37. The frame 38 serves as a leading mark for corrections which are carried out by supplying the control signals to the positioning elements 36, 37 whereby the sensor 35 is correctly adjusted to the code carrier for compensating the displacements and tilts. The positioning element 36 serves for the compensation of displacements whereas the positioning element 37 compensates the tilts. An engagement on the convex end surfaces of the positioning elements 36, 37 can be caused by spring pressure on the sensor 35. The positioning elements 36, 37 have piezo-crystals.

This way of correction of misalignment is especially suitable for the rod-shaped lenses and micro-lens plates which have to be used according to the invention since these reproducing systems must not fundamentally follow the movements of the code carrier and the sensor as long as the code carrier comprising the code tracks and the reference tracks remains in the field of vision of the optical system.

What is claimed is:

1. An electro-optical scanner particularly for position-, angle- and rotation-measuring instruments, comprising an illuminated or transilluminated code carrier, at least one optically scannable code track on said code carrier, an electro-optical sensor having a light-sensitive surface, and a rod-shaped lens adapted to reproduce said code track on said light-sensitive surface.

2. The scanner according to claim 1, further comprising a plurality of rod-shaped lenses which are arranged parallel to each other between said code track and said sensor.

3. The scanner according to claim 2, wherein said parallel lenses have partly overlapping fields of vision on said code carrier.

4. The scanner according to claim 3, wherein each pair of said plurality of rod-shaped lenses comprises a first lens in which the light of a light source is fed on the side opposed to said code carrier, and a second lens in which the light which has the contrary direction with respect to the fed-in light is directed towards said sensor on the side opposed to said code carrier and is separated by said light of said light source by a certain distance.

5. The scanner according to claim 4, wherein a screening wall is placed between said light source and said sensor.

6. The scanner according to claim 2, wherein said rod-shaped lenses are interconnected and define a bundle.

7. The scanner according to claim 1, wherein a light source is located on a side of said code carrier, said side being opposed from said sensor and transilluminates said code carrier.

8. The scanner according to claim 1, wherein said code carrier comprises at least one optically scannable reference track, said sensor comprises at least one light-sensitive reference sensor surface associated with said reference track, for the detection of a misalignment of said code carrier to said sensor, an evaluation unit is provided for transforming said signals of each reference sensor surface in control signals, and at least one positioning element engages said sensor to adjust said sensor to said code carrier in dependence on said control signals.

9. The scanner according to claim 8, wherein parallel reference tracks and associated reference sensor surfaces are provided, the differential signals thereof being transformed in said control signals by said evaluation unit.

10. The scanner according to claim 9, wherein two reference sensor surfaces at best partly record each of said associated reference tracks in transverse direction, and the distance between the faced sides of said two reference sensor surfaces corresponds to the distance between the faced sides of said reference tracks.

11. The scanner according to claim 10, wherein the distance between both reference tracks corresponds to the dimension of a reference track in transverse direction.

12. The scanner according to claim 9, wherein the distance from the inner surface of one reference sensor surface to the outer surface of the other reference sensor surface corresponds to the distance from the inner surface of one reference track to the outer surface of the other reference track.

13. The scanner according to claim 12, wherein reference tracks are located on both sides of said at least one code track.

14. The scanner according to claim 12, wherein two pairs of parallel reference tracks and reference sensor surfaces are provided, with said pairs of reference sensor surfaces being displaced from each other with respect to the direction of said reference tracks.

15. The scanner according to claim 8, wherein said at least one reference track and at least one reference sensor surface are provided for the detection of a misalignment developed by a crosswise displacement of said reference track.

16. The scanner according to claim 8, wherein at least one reference sensor surface is provided for the detection of a misalignment developed by a tilt of said reference track.

17. The scanner according to claim 8, wherein said positioning element comprises a piezo-crystal.

18. An electro-optical scanner particularly for position-, angle-, and rotation-measuring instruments, comprising an illuminated or transilluminated code carrier, at least one optically scannable code track on said code carrier, an electro-optical sensor having a light-sensitive surface, and a micro-lens plate adapted to record said code track on said light-sensitive surface.

19. The scanner according to claim 18, wherein a light source is located on a side of said code carrier, said side being opposed from said sensor and transilluminates said code carrier.

20. The scanner according to claim 18, wherein said lenses of the micro-lens plate have an aspheric curvature.

21. The scanner according to claim 18, wherein said microlens plate is made of plastic.

22. The scanner according to claim 18, wherein said micro-lens plate comprises micro-lens fields which are arranged in zones and which are adapted to cooperativley reproduce said code track on sad light-sensitive surface of said sensor.

23. The scanner according to claim 18, wherein the contour of said micro-lens plate at least selectivley corresponds to the contour of said code carrier, with the contour of said plate being rectangular.

* * * * *

UNITED STATES PATENT AND TRADEMARK OFFICE
CERTIFICATE OF CORRECTION

PATENT NO. : 5,251,012
DATED : October 5, 1993
INVENTOR(S) : Johannes Riegger et al It is certified that error appears in the above-indentified patent and that said Letters Patent is hereby corrected as shown below:

On the title page, Item [73] Assignee should read
--hohner Elektrotechnik KG--.

Signed and Sealed this

Fourth Day of October, 1994

BRUCE LEHMAN

Attest:

Attesting Officer

Commissioner of Patents and Trademarks